(12) United States Patent
Sato

(10) Patent No.: US 9,076,750 B2
(45) Date of Patent: Jul. 7, 2015

(54) SEMICONDUCTOR WAFER AND MANUFACTURING METHOD THEREOF

(75) Inventor: Michito Sato, Nishishirakawa (JP)

(73) Assignee: SHIN-ETSU HANDOTAI CO., LTD., Tokyo (JP)

( * ) Notice: Subject to any disclaimer, the term of this patent is extended or adjusted under 35 U.S.C. 154(b) by 0 days.

(21) Appl. No.: 14/005,975

(22) PCT Filed: Apr. 3, 2012

(86) PCT No.: PCT/JP2012/002304
§ 371 (c)(1),
(2), (4) Date: Sep. 18, 2013

(87) PCT Pub. No.: WO2012/147279
PCT Pub. Date: Nov. 1, 2012

(65) Prior Publication Data
US 2014/0008768 A1    Jan. 9, 2014

(30) Foreign Application Priority Data
Apr. 26, 2011  (JP) ................................ 2011-098241

(51) Int. Cl.
*H01L 29/06* (2006.01)
*H01L 21/78* (2006.01)
(Continued)

(52) U.S. Cl.
CPC .......... *H01L 29/34* (2013.01); *H01L 21/02024* (2013.01); *H01L 21/0201* (2013.01)

(58) Field of Classification Search
CPC ............ H01L 29/0657; H01L 2924/14; H01L 21/6835; H01L 23/544; H01L 21/78; H01L 23/585; H01L 23/562; H01L 2924/01079; H01L 2924/01078; H01L 2924/01029; H01L 2924/01013

USPC ................... 438/113, 458, 462; 257/618–628
See application file for complete search history.

(56) References Cited

U.S. PATENT DOCUMENTS

2007/0141958 A1* 6/2007 Moon ............................ 451/41
2009/0057840 A1* 3/2009 Netsu et al. ................... 257/618
(Continued)

FOREIGN PATENT DOCUMENTS

| JP | A-06-155286 | 6/1994 |
| JP | A-08-257893 | 10/1996 |

(Continued)

OTHER PUBLICATIONS

International Preliminary Report on Patentability Issued in Application No. PCT/JP2012/002304; Dated Oct. 29, 2013.

(Continued)

*Primary Examiner* — Steven Loke
*Assistant Examiner* — Didarul Mazumder
(74) *Attorney, Agent, or Firm* — Oliff PLC

(57) ABSTRACT

A semiconductor wafer having sag formed at an outer periphery at the time of polishing, wherein a displacement of the semiconductor wafer in a thickness direction is 100 nm or less between a center and a outer peripheral sag start position of the semiconductor wafer, and the center of the semiconductor wafer has a convex shape, an amount of outer peripheral sag of the semiconductor wafer is 100 nm or less, and the outer peripheral sag start position is away from an outer peripheral portion of the semiconductor wafer toward the center or 20 mm or more away from an outer peripheral end of the semiconductor wafer toward the center, the outer peripheral portion being a measurement target of ESFQR.

4 Claims, 15 Drawing Sheets

(51) Int. Cl.
*H01L 29/34* (2006.01)
*H01L 21/02* (2006.01)

(56) References Cited

U.S. PATENT DOCUMENTS

| | | | |
|---|---|---|---|
| 2010/0210188 A1* | 8/2010 | Roettger et al. | 451/57 |
| 2011/0081832 A1* | 4/2011 | Nakamura et al. | 451/28 |

FOREIGN PATENT DOCUMENTS

| | | |
|---|---|---|
| JP | A-2001-326197 | 11/2001 |
| JP | A-2002-064071 | 2/2002 |
| JP | A-2003-163192 | 6/2003 |
| JP | A-2003-285262 | 10/2003 |
| JP | A-2007-031883 | 2/2007 |
| JP | A-2007-067179 | 3/2007 |
| JP | A-2008-254124 | 10/2008 |
| JP | A-2009-090397 | 4/2009 |
| WO | WO 01/96065 A1 | 12/2001 |

OTHER PUBLICATIONS

Japanese Office Action issued in Application No. 2011-098241; Dated Nov. 5, 2013 (With Translation).
Mar. 25, 2014 Office Action issued in Japanese Patent Application No. 2011-098241 (with English translation).
International Search Report issued in Application No. PCT/JP2012/002304; Dated Jun. 26, 2012.
Mar. 24, 2015 Office Action issued in Taiwanese Patent Application No. 101112481.

* cited by examiner (a)

(b)

(a)

(b)

(a)

(b)

(c)

$$ZDD(R) \equiv \frac{\partial^2 \overline{Z}(R)}{\partial R^2} = \frac{{}^{c-b}\!/\!_d - {}^{b-a}\!/\!_d}{d} = \frac{c + a - 2b}{d^2}$$

SEMICONDUCTOR WAFER AND MANUFACTURING METHOD THEREOF

TECHNICAL FIELD

The present invention relates to a semiconductor wafer that meets a plurality of flatness parameters and a manufacturing method thereof.

BACKGROUND ART

In recent years, with advancement of miniaturization, a wafer shape that even an outer peripheral portion of a semiconductor wafer is flat has been demanded, and new indexes such as ROA (Roll Off Amount, which is also referred to as an edge roll off amount) that evaluates flatness of a semiconductor wafer outer peripheral portion, ESFQR (Edge Site Front-surface-referenced least sQuares/Range), ZDD (Z-Height Double Differentiation) that evaluates a change in curvature, and others have been used in addition to GBIR (Global Back-surface-referenced Ideal plane/Range), SFQR (Site Frontsur-face-referenced least sQuares/Range), SBIR (Site Backsur-face-reference Ideal plane/Range), and others that are conventional flatness evaluation indexes.

A removal stock of the polished semiconductor wafer outer peripheral portion increases due to contact with a polishing pad, and outer periphery sag occurs as a shape after polishing. Usually, ROA or ESFQR is calculated with use of data from a semiconductor wafer outer peripheral end to a point that is 1 mm apart therefrom, and SFQR or SBIR is calculated with use of data from the semiconductor wafer outer peripheral end to a point that is 2 mm apart therefrom. Therefore, ROA or ESFQR is highly affected by the outer peripheral sag as compared with SFQR or SBIR. Further, a thickness of the semiconductor wafer greatly varies in a region from the wafer outer peripheral end to a point that is 0.5 to 1 mm from this end and, if an outer peripheral excluded region of ROA or ESFQR is further reduced from 1 mm in the future, ROA or SFQR will be more highly affected by the outer peripheral sag. A flatness index defined in the SEMI standard will now be individually described hereinafter.

GBIR is a backsurface-referenced global flatness index, and it is used for evaluation of flatness concerning an entire wafer surface defined except a peripheral edge portion. GBIR is defined as a width of a deviation between maximum and minimum thicknesses of a front side of a semiconductor wafer relative to a reference surface when a back side of the semiconductor surface is determined as a reference surface.

SFQR is a frontsurface-referenced site flatness index, and it is evaluated in accordance with each site. SFQR is defined as a range of positive and negative deviations from a reference surface when a cell having an arbitrary dimension (e.g., 26 mm×8 mm) is determined on a front side of a semiconductor wafer and a surface obtained by the method of least square in regard to this cell surface is determined as the reference surface. Further, a value of SFQRmax represents a maximum value of SFQR in each site on a predetermined wafer.

SBIR is a backsurface-referenced site flatness index. SBIR is a thickness deviation in a cell having an arbitrary dimension (e.g., 26 mm×8 mm) on a semiconductor wafer relative to a reference surface when a back side of the semiconductor wafer is determined as a reference surface, and SBIRmax represents a maximum value of SBIR in each site. SFQR and SBIR relate to evaluation of flatness of a specific cell on a wafer surface, and this evaluation is performed with respect to a cell having a dimension that approximately corresponds to a region of a semiconductor component to be fabricated.

Definition of ROA will now be described with reference to FIG. 13. An abscissa in FIG. 13 represents a length from an outer peripheral end of a semiconductor wafer, and an ordinate in the same represents a displacement of a shape of a wafer surface. In general, ROA represents, as a sag amount, a change "d" in shape displacement from a reference surface at a position that is 0.5 mm or 1 mm from an outer peripheral end (a length from the outer peripheral end of the semiconductor wafer is represented as $r_0$ in FIG. 13) when a back side of a semiconductor wafer is corrected to a flat surface, an inclination of a front side of the semiconductor wafer is corrected, and a flat region that is 3 to 6 mm from the outer peripheral end of the semiconductor wafer (between $r_1$ and $r_2$ in FIG. 13) is determined as the reference surface. An outer peripheral end side of $r_0$ is also referred to as an outer periphery excluded region (which is also referred to as a peripheral portion excluded region and corresponds to a length of a portion, which is outside the application range of the flatness standard, from the outer peripheral end).

Definition of ZDD will now be described with reference to FIG. 14. An abscissa in FIG. 14 represents a length from an outer peripheral end of a semiconductor wafer, and an ordinate in the same represents a displacement of a shape of a wafer surface. In general, ZDD means a second order differential of a displacement of a surface of the semiconductor wafer relative to a radius of the semiconductor wafer. A positive value of ZDD represents that a surface is displaced in a rising direction, whereas a negative value of the same represents that the surface is displaced in a sagging direction.

ESFQR is the SFQR at an edge (an outer peripheral portion), and it is a flatness index that is indicative of flatness of the outer peripheral portion. How to take a cell in ESFQR will now be described with reference to FIG. 15. FIG. 15(*a*) is a top view of a semiconductor wafer and shows that an outer peripheral portion thereof is divided into 72 rectangular regions (cells). FIG. 15(*b*) is an enlarged view of one of the rectangular regions, and the rectangular region is surrounded by a straight line $L_2$ of 35 mm extending from an outer peripheral end in a diameter direction and an arc $L_1$ corresponding to 5° in the circumferential direction of an outer peripheral portion of the semiconductor wafer, and a region of $L_3$ that is 1 mm from the outer peripheral end in the diameter direction is not included. Here, ESFQR is an SFQR value (a range of positive and negative deviations from a least-square plane in the region) of this rectangular region (the cell). In case of ESFQR, an outer peripheral end side indicative of $L_3$ is determined as an outer periphery excluded region.

CITATION LIST

Patent Literature

Patent Literature 1: Japanese Unexamined Patent Publication (Kokai) No. H08-257893

SUMMARY OF INVENTION

Technical Problem

The outer peripheral sag is a portion formed when an outer peripheral portion of a wafer is excessively polished and rounded with a curvature without being formed into a flat surface due to an increase in polishing pressure caused by deformation of a polishing pad. To reduce an influence of such deformation of the polishing pad, using a polishing head having a retainer mechanism is known (Patent Literature 1). However, under existing conditions that a soft polishing pad is used to reduce scratches on a wafer surface, suppressing deformation of the polishing pad is difficult, and there is a limit in improvement of the outer peripheral sag in principle.

On the other hand, there are the frontsurface-referenced flatness standard and the backsurface-referenced flatness standard, and it is difficult to meet both the standards having the different reference surfaces under the same manufacturing conditions. Therefore, the set-up change of manufacturing condition change is required, and there is a problem that productivity is thereby lowered.

Furthermore, even if the same surface reference is used, a value of ESFQR or the like varies depending on a difference between outer periphery excluded regions, and hence there is also a problem that a yield is lowered. To solve such a problem, for example, to improve ESFQR, there is adopted a technique for polishing the outer peripheral portion so that it can slightly rise and reducing a maximum displacement from a least square plane in the outer peripheral region. However, sag of the outermost peripheral portion of the wafer still cannot be improved, and an inflection point involved by a change into a sag shape from the rising shape formed by polishing is produced. As a result, this technique is suitable for improvement in a value of ROA or ESFQR up to 1 mm in EE (Edge Exclusion: an outer periphery excluded region) having a large variation in thickness of the wafer, but it is not suitable for improvement in SFQR or ZDD that 2 mm in EE forms the mainstream, and meeting a plurality of flatness indexes at the same time is difficult.

To solve the above-described problem, it is an object of the present invention to provide a semiconductor wafer that can meet a plurality of flatness indexes such as SFQR, ESFQR, ZDD, ROA, GBIR, SBIR, and others under the same processing conditions at the same time, and to provide a manufacturing method thereof.

Solution to Problem

To achieve the object, according to the present invention, there is provided a semiconductor wafer having sag formed at an outer periphery at the time of polishing, wherein a displacement of the semiconductor wafer in a thickness direction is 100 nm or less between a center and a outer peripheral sag start position of the semiconductor wafer, and the center of the semiconductor wafer has a convex shape, an amount of outer peripheral sag of the semiconductor wafer is 100 nm or less, and A semiconductor wafer having sag formed at an outer periphery at the time of polishing, wherein a displacement of the semiconductor wafer in a thickness direction is 100 nm or less between a center and an outer peripheral sag start position of the semiconductor wafer, the center of the semiconductor wafer has a convex shape, an amount of the outer peripheral sag of the semiconductor wafer is 100 nm or less, and the outer peripheral sag start position is away from an outer peripheral portion of the semiconductor wafer toward the center or 20 mm or more away from an outer peripheral end of the semiconductor wafer toward the center, the outer peripheral portion being a measurement target of ESFQR.

According to such a semiconductor wafer shape, in the plurality of flatness indexes such as SFQR, ESFQR, ROA, and others having different edge exclusions, deviations from the respective reference surfaces can be minimized at the same time, and the combination of the convex shape at the center of the semiconductor wafer (which will be also referred to as a center convex shape hereinafter) and the outer peripheral sag shape enables also suppressing a change in curvature that occurs at the outer peripheral portion. Moreover, when the semiconductor wafer having such a shape is adopted, not only the frontsurface-referenced flatness indexes but also the backsurface-referenced flatness indexes (GBIR, SBIR, and others) and the curvature evaluation index such as ZDD can be met at the same time. As a result, it is possible to cope with demands of all customers under the same polishing conditions, and a plurality of customer demands can be met. Moreover, since management can be carried out under the same processing conditions, and hence productivity or a yield of the semiconductor wafer can be improved.

Additionally, it is preferable for the amount of outer peripheral sag to be 70 nm or less.

As a result, there can be obtained the semiconductor wafer having the improved flatness indexes such as SFQR, ESFQR, ZDD, ROA, GBIR, SBIR, and others.

Further, in the present invention, there is provided a method for manufacturing a semiconductor wafer comprising a polishing step of polishing the semiconductor wafer after slicing a single-crystal ingot to obtain the semiconductor wafer and chamfering and flattening the semiconductor wafer, wherein, at the polishing step, the semiconductor wafer is subjected to double-sided polishing in such a manner that a displacement of the semiconductor wafer in a thickness direction becomes 100 nm or less between a center and an outer peripheral sag start position of the semiconductor and the center of the semiconductor wafer has a convex shape, and one side of the semiconductor wafer is then subjected to chemical-mechanical polishing in such a manner that an amount of outer peripheral sag of the semiconductor wafer becomes 100 nm or less and the outer peripheral sag start position is the outer peripheral sag start position is away from an outer peripheral portion of the semiconductor wafer toward the center or 20 mm or more away from an outer peripheral end of the semiconductor wafer toward the center, the outer peripheral portion being a measurement target of ESFQR.

When the semiconductor wafer is subjected to the double-side polishing in this manner, it is possible to easily manufacture the semiconductor wafer that a displacement of the semiconductor wafer in the thickness direction is 100 nm or less between the center of the semiconductor wafer and the outer peripheral sag start position and the center of the semiconductor wafer has the convex shape. Additionally, when one side of the semiconductor wafer is subjected to chemical-mechanical polishing, it is possible to easily manufacture the semiconductor wafer that the amount of the outer peripheral sag is 100 nm or less and the outer peripheral sag start position is the outer peripheral sag start position is away from an outer peripheral portion of the semiconductor wafer toward the center or 20 mm or more away from an outer peripheral end of the semiconductor wafer toward the center, the outer peripheral portion being a measurement target of ESFQR.

Further, at the polishing step, the semiconductor wafer is preferable in such a manner that the amount of outer peripheral sag becomes 70 nm or less.

As a result, it is possible to manufacture the semiconductor wafer having the improved flatness indexes such as SFQR, ESFQR, ZDD, ROA, GBIR, SBIR, and others.

Furthermore, in the chemical-mechanical polishing, it is preferable for the semiconductor wafer is polished with use of a nonwoven type polishing pad having an Asker-C hardness (hardness measured by a spring-type hardness tester type C conforming to JIS K6301) of 60 or more or a polyurethane type polishing pad having a Shore-D hardness of 55 or more.

Although the amount of sag obtained by the chemical-mechanical polishing also varies depending on polishing conditions, a ratio of the polishing pad dependent on an amount of deformation is high, selecting such a polishing pad with high hardness can obtain a desired amount of sag by adjusting the polishing conditions. Moreover, it is possible to further readily manufacture the semiconductor wafer that the amount of the outer peripheral sag is 100 nm or less and the outer peripheral sag start position is the outer peripheral sag start position is away from an outer peripheral portion of the semiconductor wafer toward the center or 20 mm or more away from an outer peripheral end of the semiconductor wafer toward the center, the outer peripheral portion being a measurement target of ESFQR.

Advantageous Effect of Invention

According to the semiconductor wafer shape of the present invention, in the plurality of flatness indexes, e.g., SFQR, ESFQR, ROA, and others having different edge exclusions, deviations from the respective reference surfaces can be minimized at the same time, and the combination of the center convex shape and the outer peripheral sag shape enables also suppressing a change in curvature that occurs at the outer peripheral portion. Furthermore, when the semiconductor wafer having such a shape is adopted, not only the frontsurface-referenced flatness indexes but also the backsurface-referenced flatness indexes (GBIR, SBIR, and others) and the curvature evaluation index such as ZDD can be met at the same time. As a result, it is possible to cope with demands of all customers under the same polishing conditions, and a plurality of customer demands can be met. Moreover, since management can be carried out under the same processing conditions, and hence productivity or a yield of the semiconductor wafer can be improved.

DESCRIPTION OF EMBODIMENTS

Although the present invention will now be explained hereinafter in more detail, the present invention is not restricted thereto. The present invention is preferable when a semiconductor wafer is a silicon wafer and particularly preferable with respect to a silicon wafer having a diameter of 300 mm or more, and a case where a semiconductor wafer is a silicon wafer will be mainly explained hereinafter. However, the present invention is not restricted thereto, and it can be also applied to a semiconductor wafer other than the silicon wafer.

[Relationship Between Shape of Conventional Silicon Wafer, SFQR, and ESFQR]

Figure 2:
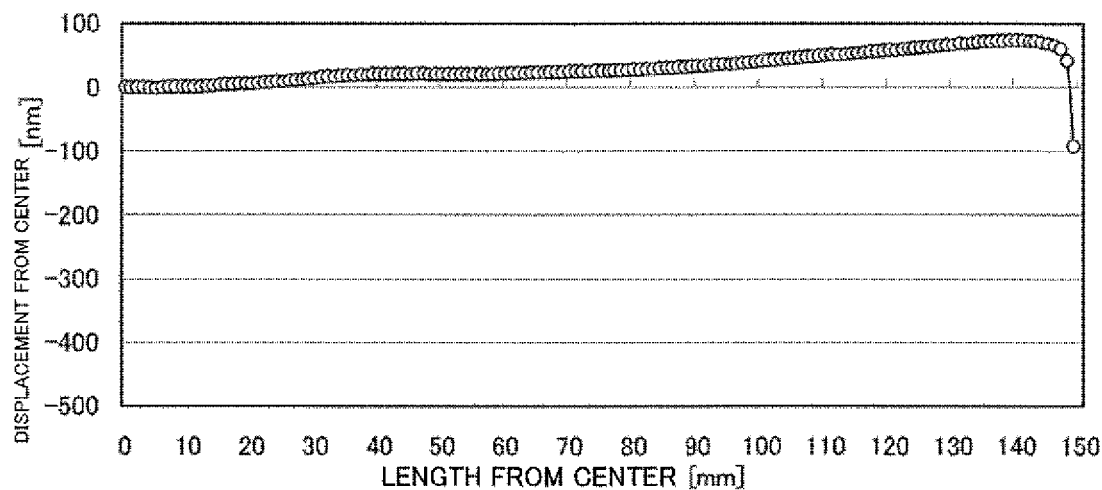
FIG. 2(a) is a view showing a first mode of a cross-sectional shape of a conventional silicon wafer, and (b) is a view showing the cross-sectional shape of an outer peripheral portion of the conventional silicon wafer and reference lines of SFQR and ESFQR.
Figure 2:
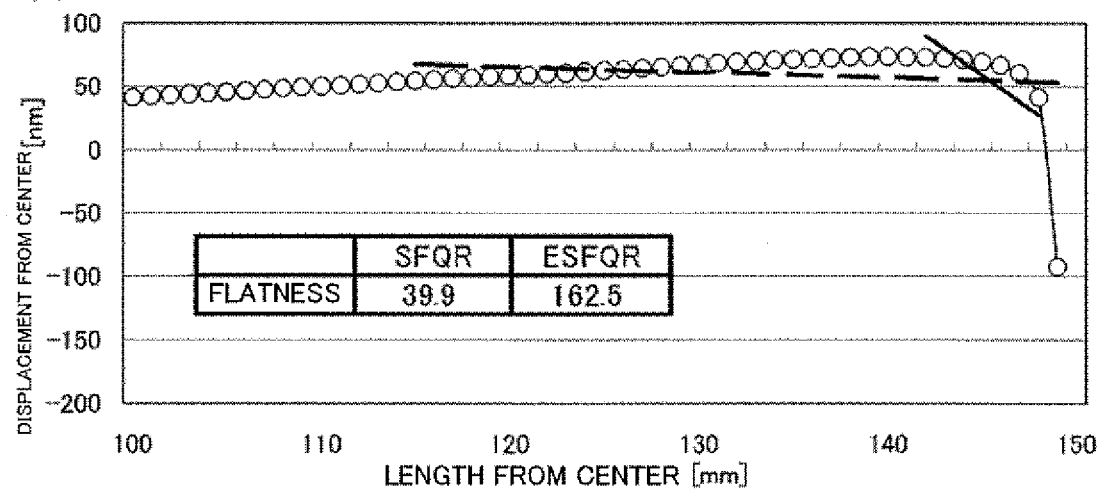
Figure 3:
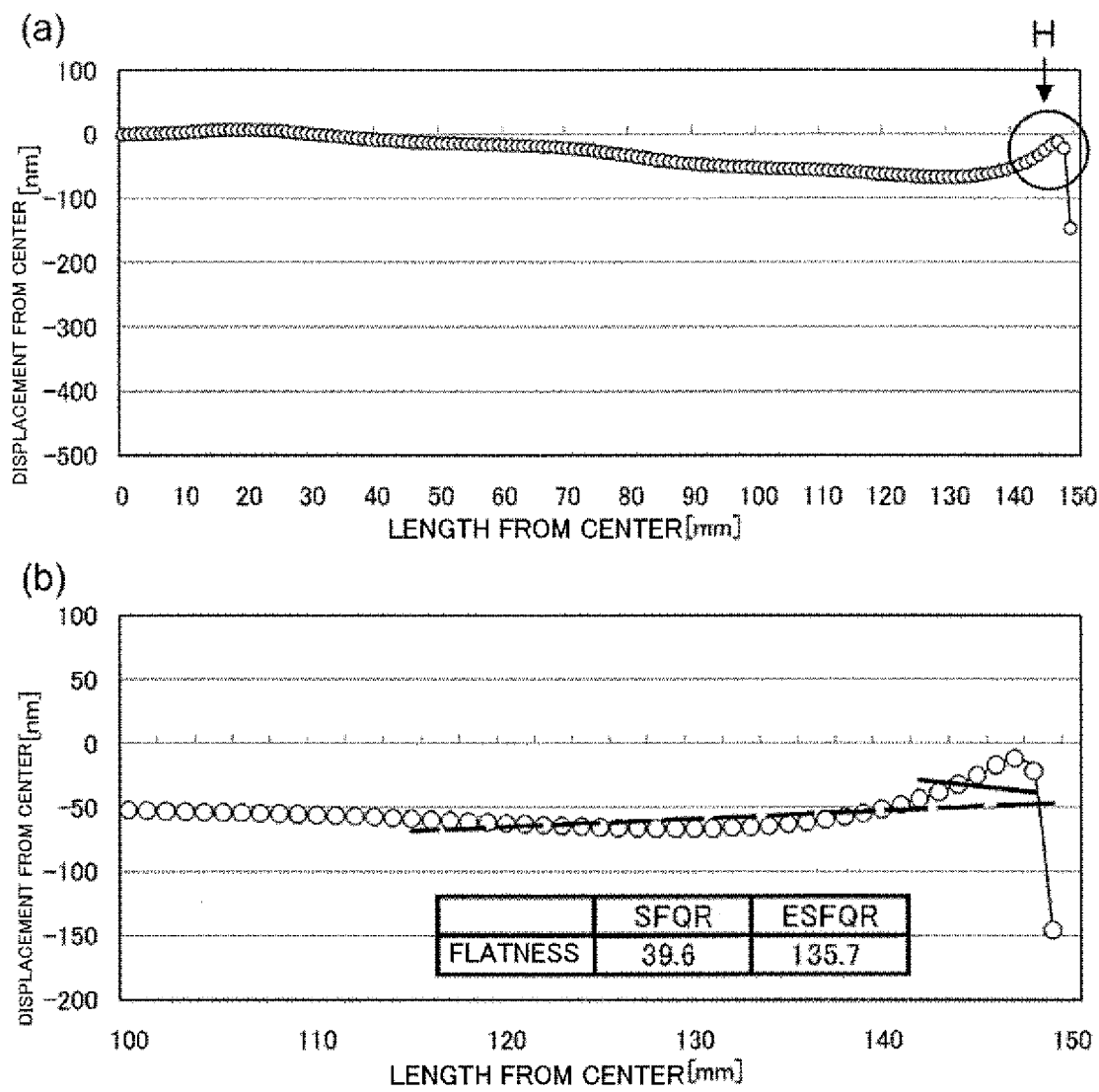
FIG. 3(a) is a view showing a second mode of the cross-sectional shape of the conventional silicon wafer, and (b) is a view showing a cross-sectional shape of the outer peripheral portion of the conventional silicon wafer and reference lines of SFQR and ESFQR.
Figure 4:
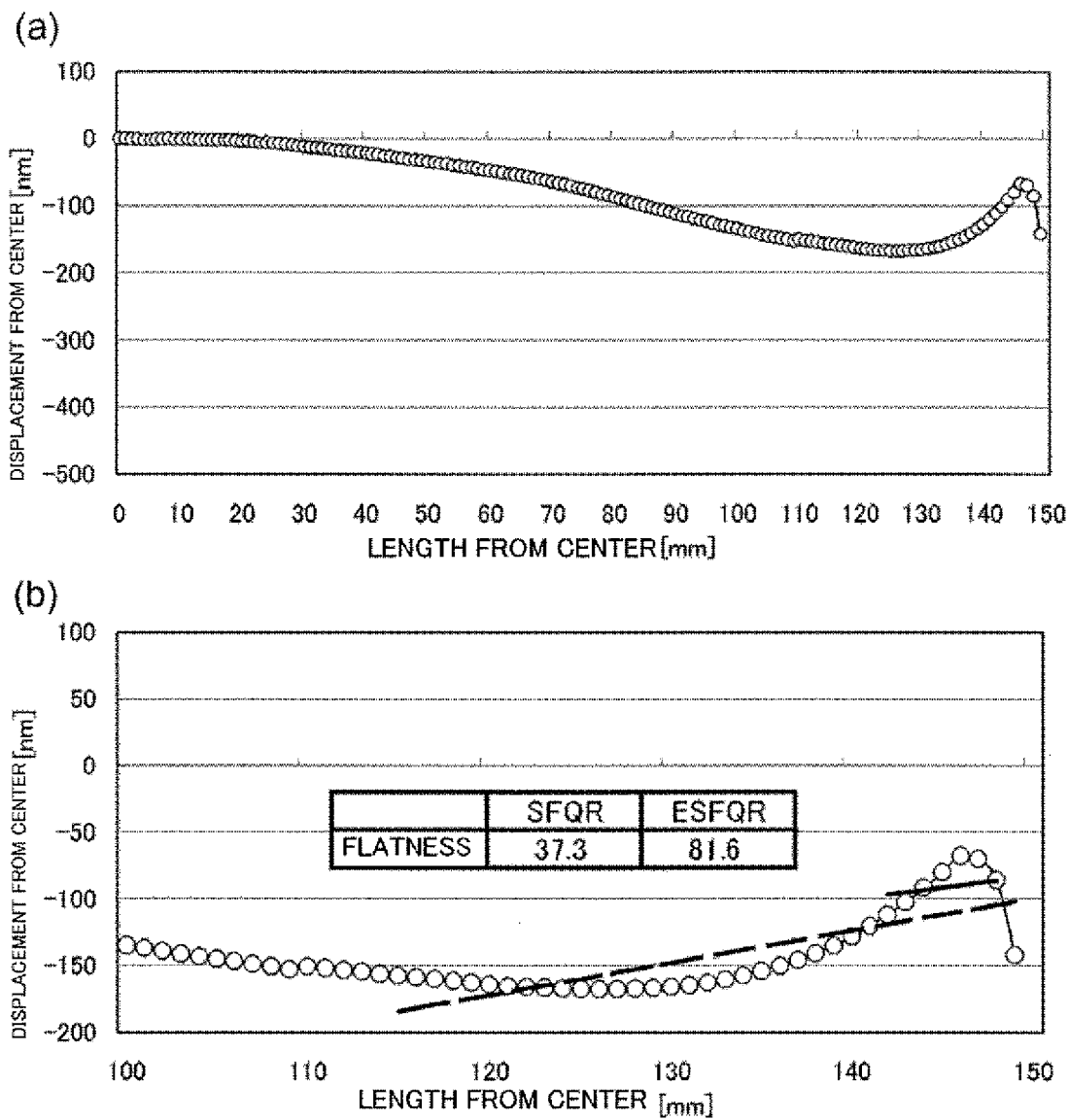
FIG. 4(a) is a view showing a third mode of the cross-sectional shape of the conventional silicon wafer, and (b) is a view showing the cross-sectional shape of the outer peripheral portion of the silicon wafer and reference lines of SFQR and ESFQR.

FIGS. 2 to 4 illustrate first to third modes of a cross-sectional shape of a conventional silicon wafer having a diameter of 300 mm. Each of FIG. 2(a), FIG. 3(a), and FIG. 4(a) shows a silicon wafer polished into a shape that an outer periphery rises (which will be also referred to as a rising shape hereinafter) to suppress sag. The rising shape means a shape represented by H in FIG. 3(a), for example. Here, as shown in FIGS. 2 to 4, the rise increases in the order of FIG. 2, FIG. 3, and FIG. 4. Each of FIG. 2(b), FIG. 3(b), and FIG. 4(b) shows a cross-sectional shape of an outer peripheral portion of the silicon wafer, a reference line (a broken line) of SFQR, and a reference line (a solid line) of ESFQR. Although SFQR or ESFQR is essentially calculated from a reference surface of a cell size, temporary SFQR or ESFQR was calculated with use of reference lines obtained by the least-square method from data of the cross-sectional shape of the silicon wafer in order to facilitate understanding an influence of the cross-sectional shape of the silicon wafer on SFQR or ESFQR.

Here, edge exclusion of SFQR was determined as a region that is 2 mm from a wafer outer peripheral end, a cell size was assumed to be 26 mm×8 mm, and the reference line (the broken line) was obtained by the least-square method. Likewise, an edge exclusion of ESFQR was determined as a region that is 1 mm from a wafer outer peripheral end, a rectangular region as a measurement target was determined as a region that is 1 mm to 35 mm and 5° from the wafer outer peripheral end, and the reference line (the broken line) was obtained by the least-square method. The calculation was carried out with the reference line (the broken line) of SFQR having a length of 8 mm and the reference line (the solid line) of ESFQR having a length of 35 mm so that a difference between SFQR and ESFQR can be assured.

Table 1 shows a result. SFQR of the silicon wafer shown in FIG. 2 and FIG. 3 is as substantially the same as approximately 40 nm, and a displacement at a position that is 2 mm from the outer peripheral end (148 mm from the center) and a displacement (ROA) at a position that is 1 mm from the outer peripheral end (149 mm from the center) were substantially the same as approximately 130 nm. However, ESFQR of the silicon wafer in FIG. 3 having the outer periphery rise is approximately 30 nm better than the silicon wafer in FIG. 2. Therefore, to improve ESFQR, it can be understood that polishing to form a shape that the outer peripheral portion slightly rises as shown in FIG. 3(b) is effective. In the silicon wafer in FIG. 4 having the maximum rise to improve ESFQR, although ESFQR is improved in the silicon wafer in FIG. 4 having the slight raised shape to improve ESFQR, SFQR is hardly improved with improve ESFQR and having the maximum rise due to an influence of a inflection point from a rise to a sag. That is, in a conventional wafer manufacturing method, it is difficult for the conventional wafer manufacturing method for polishing that forms the rise to cope with flatness demand which will become more severe in the future. In particular, when improving SFQR and ESFQR at the same time is demanded, meeting the demands is difficult.

TABLE 1

| | Shape | Outer peripheral sag start position (mm) | Amount of sag (nm) | SFQR (nm) | ESFQR (nm) |
|---|---|---|---|---|---|
| FIG. 2 | Rise (small) | 5 | 130 | 39.9 | 162.5 |
| FIG. 3 | Rise (medium) | 5 | 130 | 39.6 | 135.7 |
| FIG. 4 | Rise (large) | 5 | 60 | 37.3 | 81.6 |

[Influence of Unevenness of Silicon Wafer on Flatness Index]

Figure 5:
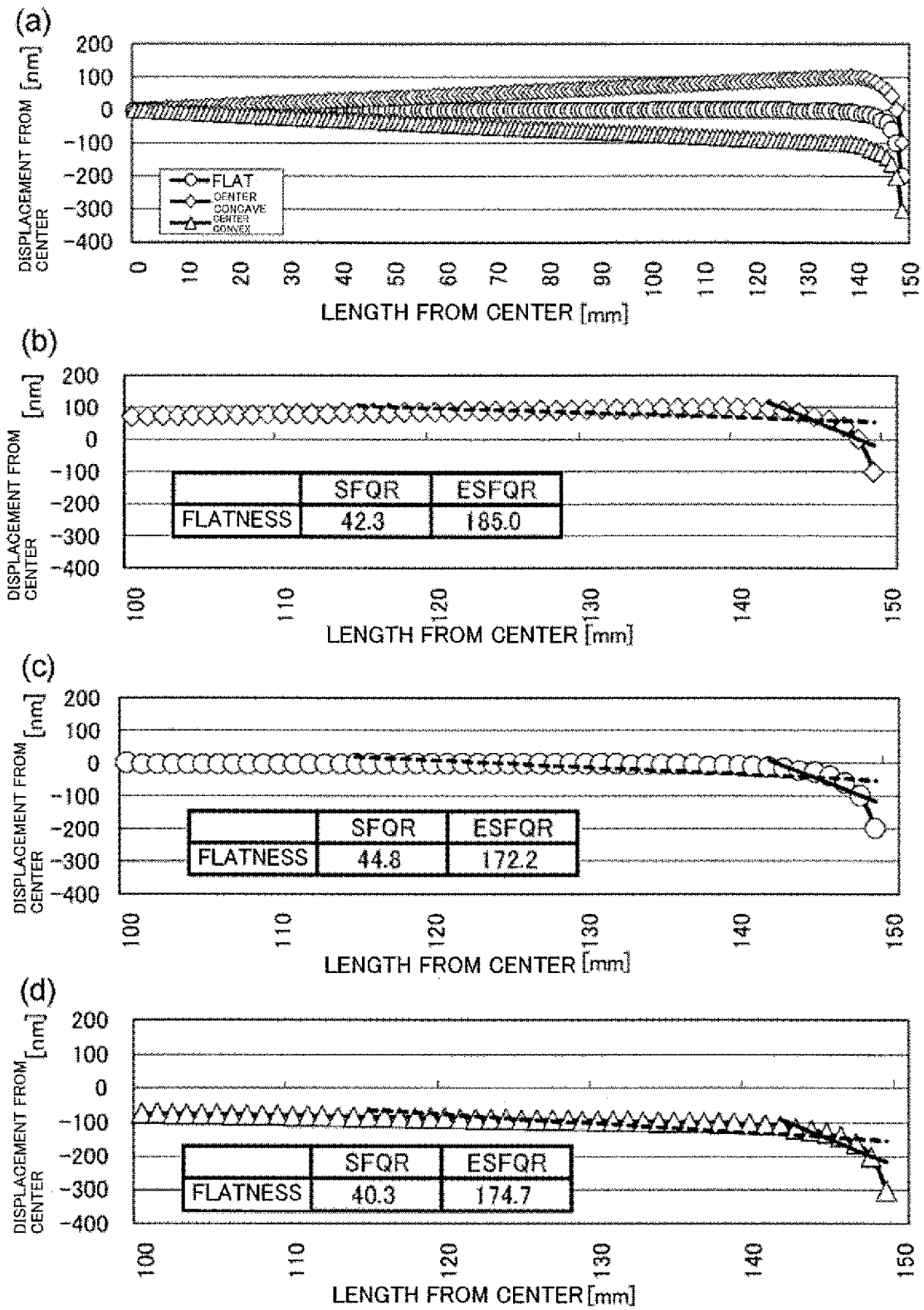
FIG. 5(a) is a view showing cross-sectional shapes of silicon wafers having a center concave shape (◇), a flat shape (○), and a center convex shape (Δ), (b) is a view showing the cross-sectional shape of the outer peripheral portion of the silicon wafer having the center concave shape and reference lines of SFQR and ESFQR, (c) is a view showing the cross-sectional shape of the outer peripheral portion of the silicon wafer having the flat shape and the reference lines of SFQR and ESFQR, and (d) is a view showing the cross-sectional shape of the outer peripheral portion of the silicon wafer having the center convex shape and the reference lines of SFQR and ESFQR.

To find out a method for improving both SFQR and ESFQR at the same time, the present inventors conducted simulation in regard to an influence of unevenness of a silicon wafer on flatness based on a shape of a current silicon wafer. FIG. 5(a) shows cross-sectional shapes of three silicon wafers used for the simulation. FIG. 5 shows cross-sectional shapes of silicon wafers in case of a flat shape (○), in case of a center concave shape (a position at an outer periphery that is 10 mm from the center is 100 nm thicker) (◇), and in case of a center convex shape (a position at an outer periphery that is 10 mm from the center is 100 nm thinner) (Δ). In this simulation, these three silicon wafers have the same sag shape on the outer side that is 10 mm from the outer peripheral end (140 mm from the center). It is to be noted that a diameter of each silicon wafer was set to 300 mm.

Each of FIGS. 5(b) to (d) shows a cross-sectional shape of an outer peripheral portion of a silicon wafer having each shape and reference lines of SFQR and ESFQR. Based on these, SFQR and ESFQR of each silicon wafer shown in FIG. 5 were calculated. It is to be noted that the reference lines were defined like the examples shown in FIGS. 2 and 3, and SFQR and ESFQR were also obtained like the examples shown in FIGS. 2 and 3.

Table 2 shows its result. In case of a silicon wafer having the center concave shape, SFQR was on an intermediate level, but ESFQR was the worst (FIG. 5(b)). In case of a silicon wafer having the flat shape, ESFQR was the best, but SFQR was the worst (FIG. 5(c)). In case of having the center convex shape, SFQR was the best, and ESFQR was on the level close to the flat shape that leads to the best result (FIG. 5(d)). As a result, it can be understood that the center convex shape facilitates achieving both SFQR and ESFQR. That is, to improve both SFQR and ESFQR, a shape (a convex shape) that enables respective virtual lines of SFQR and ESFQR to have inclinations that are as the same as possible.

TABLE 2

| | Shape | Outer peripheral sag start position (mm) | Amount of sag (nm) | SFQR (nm) | ESFQR (nm) |
|---|---|---|---|---|---|
| FIG. 5(b) | Center concave shape | 10 | 200 | 42.3 | 185.0 |
| FIG. 5(c) | Flat shape | 10 | 200 | 44.8 | 172.2 |
| FIG. 5(d) | Center convex shape | 10 | 200 | 40.3 | 174.7 |

[Influence of Change in Shape from Wafer Center to Outer Periphery on Flatness Indexes]

Figure 6:
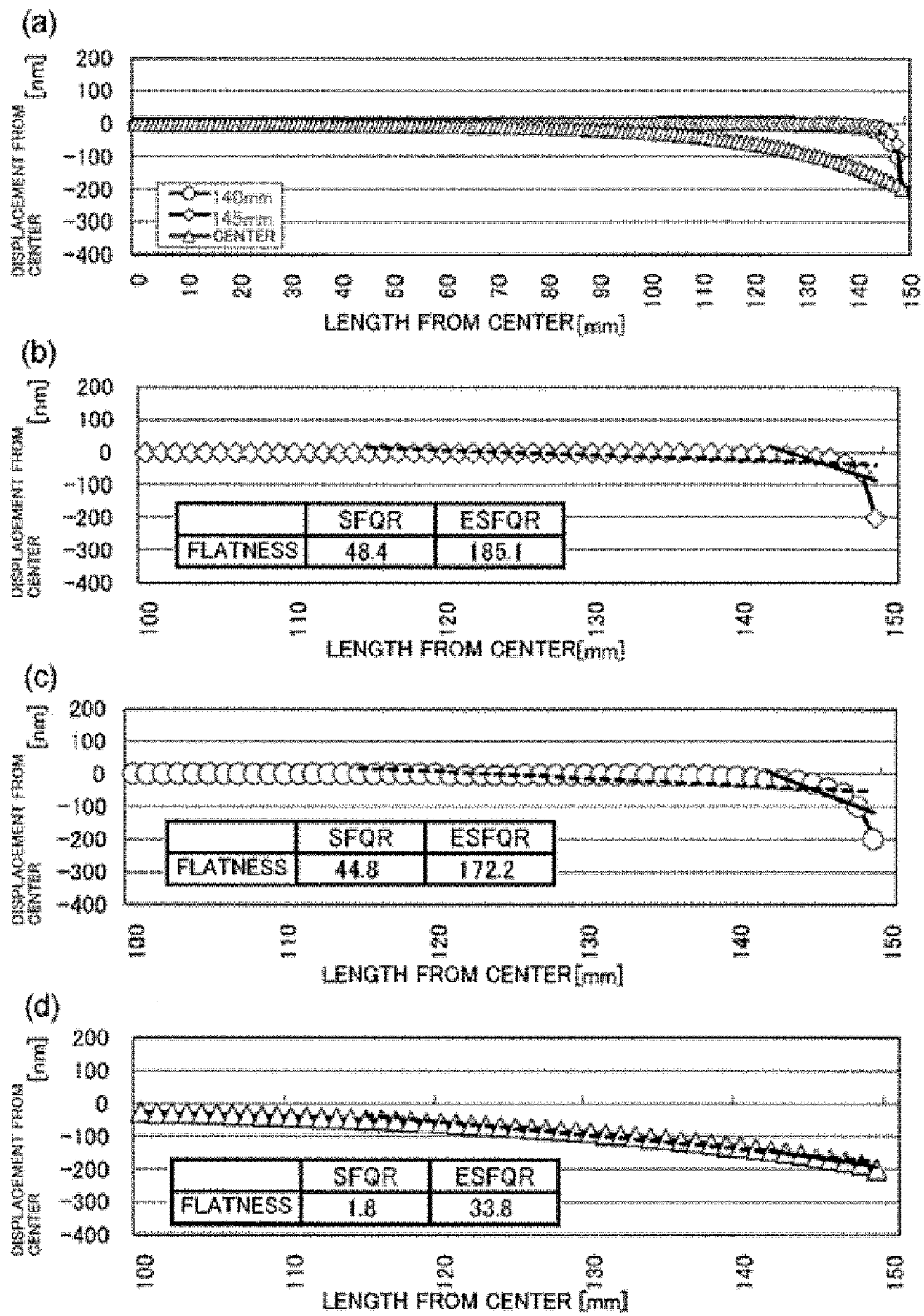
FIG. 6(a) is a view showing cross-sectional shapes of silicon wafers having a center convex shape that an amount of change in shape from the center to the outer periphery is 200 nm when a position where a change in shape due to sag starts (an outer peripheral sag start position) is a position that is 5 mm away from the outer peripheral end (145 mm from the center) (◇), when the same is a position that is 10 mm from the outer peripheral end (140 mm from the center) (○), and when the same is changed from the center to the outer periphery with the same curvature (Δ), (b) is a view showing the cross-sectional shape of the outer peripheral portion of the silicon wafer indicated by ◇ and reference lines of SFQR and ESFQR, (c) is a view showing the cross-sectional shape of the outer peripheral portion of the silicon wafer indicated by ○ and reference lines of SFQR and ESFQR, and (d) is a view showing the cross-sectional shape of the outer peripheral portion of the silicon wafer indicated by Δ and reference lines SFQR and ESFQR.

Then, the present inventors focused on a change in shape from the wafer center to the outer periphery and conducted simulation in regard to an influence of a change in shape from the wafer center to the outer periphery on the flatness indexes. FIG. 6(a) shows cross-sectional shapes of three silicon wafers used in the simulation. FIG. 6 shows cross-sectional shapes of silicon wafers having a center convex shape that an amount of change in shape from the center to the outer periphery is 200 nm when a position where a change in shape due to sag starts (an outer peripheral sag start position) is a position that is 10 mm away from the outer peripheral end (140 mm from the center) (○), when the outer peripheral sag start position is a position that is 5 mm from the outer peripheral end (145 mm from the center) (◇), and when the shape is changed from the center to the outer periphery with the same curvature (Δ). It is to be noted that a diameter of each silicon wafer is 300 mm.

Each of FIGS. 6(b) to (d) shows the cross-sectional shape of the outer peripheral portion of the silicon wafer having each shape and reference lines of SFQR and ESFQR. Based on these, SFQR and ESFQR of each silicon wafer shown in FIG. 6 were calculated. It is to be noted that the reference lines were defined like the examples shown in FIGS. 2 and 3, and SFQR and ESFQR were also obtained like the examples shown in FIGS. 2 and 3.

Table 3 shows its result. It can be understood from comparison between FIGS. 6(b) and (c) that SFQR and ESFQR are not improved even if the sag start position is shifted to the wafer outer peripheral end side and the flat portion is enlarged. However, in the center convex shape that changes from the wafer center with the same curvature, values of both SFQR and ESFQR were greatly reduced (FIG. 6(d)). As a result, it can be understood that an ideal wafer shape is a center convex shape that changes from its center to its outer periphery with the same curvature. However, obtaining a wafer having such a shape is actually difficult, and hence simulation of each silicon wafer having a manufacturable shape was conducted.

end is 100 nm thinner than that of the center) that an amount of change in shape from the center to the outer periphery is 300 nm when a position where a change in shape starts (an outer peripheral sag start position) is a position that is 10 mm away from the outer peripheral end (140 mm from the center) (○), when an amount of sag is a half, i.e., 100 nm relative to the wafer shape indicated by ○ (◊), and when the outer peripheral sag start position is 20 mm from the outer peripheral end (130 mm from the center) in the wafer shape indicated by ○ (Δ). It is to be noted that a diameter of each silicon wafer is 300 mm.

Figure 7:
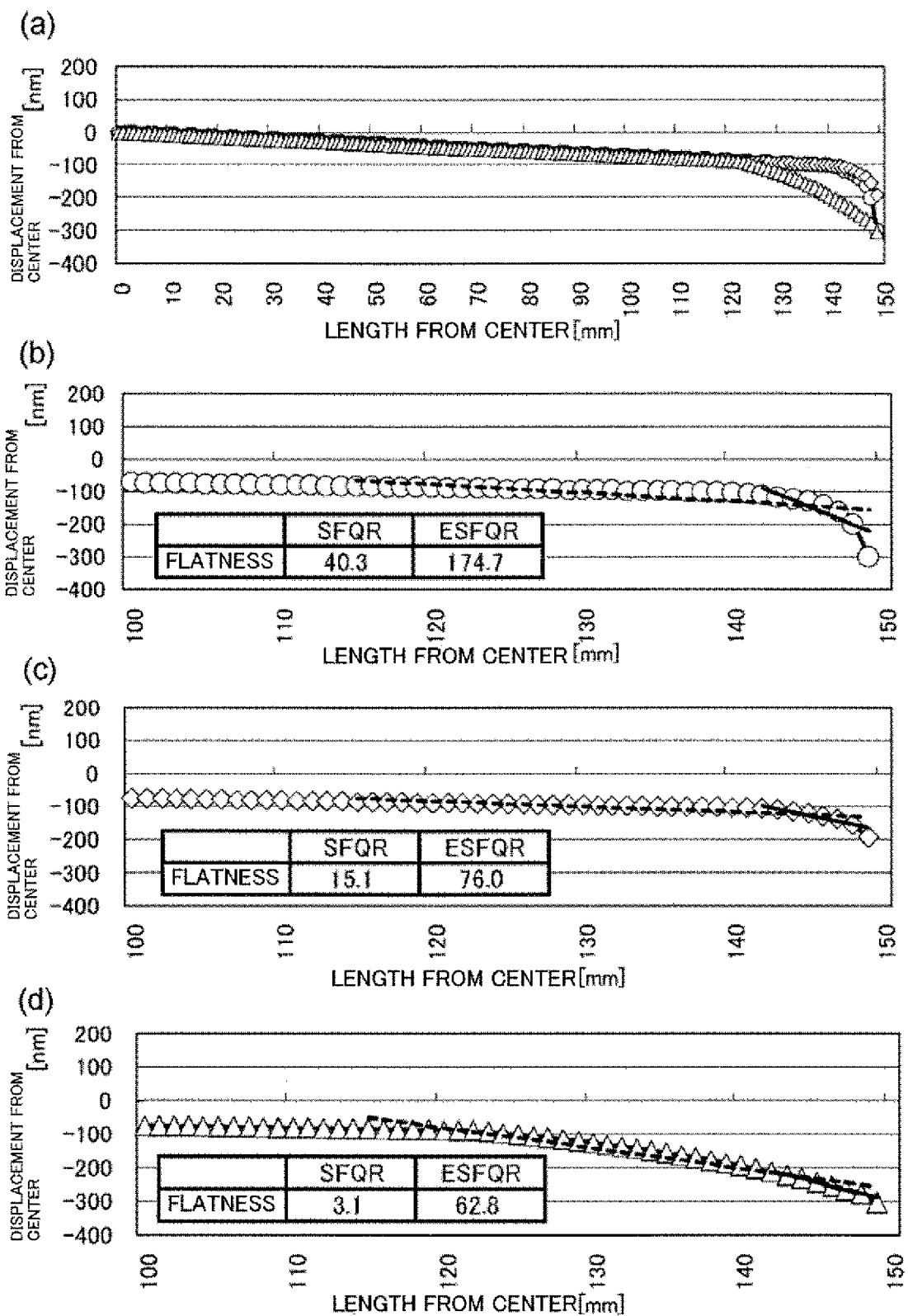
FIG. 7(a) is a view showing cross-sectional shapes of silicon wafers having a center convex shape (a thickness at an outer peripheral position that is 10 mm away from the center is 100 nm thinner) that an amount of change in shape from the center to the outer periphery is 300 nm when a position where a change in shape starts (an outer peripheral sag start position) is a position that is 10 mm away from the outer peripheral end (140 mm from the center) (○), when an amount of sag is a half, i.e., 200 nm relative to the wafer shape indicated by ○ (◇), and when the outer peripheral sag start position is 20 mm away from the outer peripheral end (130 mm from the center) (Δ), (b) is a view showing the cross-sectional shape of the outer peripheral portion of the silicon wafer indicated by ○ and reference lines of SFQR and ESFQR, (c) is a view showing the cross-sectional shape of the outer peripheral portion of the silicon wafer indicated by ◇ and reference lines of SFQR and ESFQR, and (d) is a view showing the cross-sectional view of the outer peripheral portion of the silicon wafer indicated by Δ and reference lines of SFQR and ESFQR.

Each of FIGS. 7(b) to (d) shows the cross-sectional shape of the outer peripheral portion of the silicon wafer having each shape and reference lines of SFQR and ESFQR. Based on these, SFQR and ESFQR of each silicon wafer shown in FIG. 7 were calculated. It is to be noted that the reference lines were defined like the examples shown in FIGS. 2 and 3, and SFQR and ESFQR were also obtained like the examples shown in FIGS. 2 and 3.

TABLE 3

| | Shape | Amount of change in shape (nm) | Amount of change in shape from center to outer peripheral sag start position (nm) | Outer peripheral sag start position (mm) | Amount of sag (nm) | SFQR (nm) | ESFQR (nm) |
|---|---|---|---|---|---|---|---|
| FIG. 6(b) | Flat Shape | 200 | 0 | 5 | 200 | 48.4 | 185.1 |
| FIG. 6(c) | Flat Shape | 200 | 0 | 10 | 200 | 44.8 | 172.2 |
| FIG. 6(d) | Change From center to outer periphery with same curvature | 200 | — | — | — | 1.8 | 33.8 |

[Simulation of Silicon Wafer Having Manufacturable Shape]

Subsequently, the present inventors conducted simulation in regard to each silicon wafer having a manufacturable shape. FIG. 7(a) shows cross-sectional shapes of three silicon wafers used in the simulation. FIG. 7 shows cross-sectional shapes of silicon wafers having a center convex shape (a thickness at a position that is 10 mm from the outer peripheral Table 4 shows its result. It can be understood from comparison between FIGS. 7(b) and (c) that reducing the amount of sag by half enables improving both SFQR and ESFQR. However, it can be also understood from comparison between FIGS. 7(b) and (d) that an improvement becomes more effective when the outer peripheral sag start position is moved toward the center.

TABLE 4

| | Shape | Amount of change in shape (nm) | Amount of change in shape from center to outer peripheral sag start position (nm) | Outer peripheral sag start position (mm) | Amount of sag (nm) | SFQR (nm) | ESFQR (nm) |
|---|---|---|---|---|---|---|---|
| FIG. 7(b) | Center convex shape | 300 | 100 | 10 | 200 | 40.3 | 174.7 |
| FIG. 7(c) | Center convex shape | 300 | 100 | 10 | 100 | 15.1 | 76.0 |
| FIG. 7(d) | Center convex shape | 300 | 100 | 20 | 200 | 3.1 | 62.8 |

[Correlation between Outer Peripheral Sag Start Position, Amount of Sag, SFQR, and ESFQR]

Figure 8:
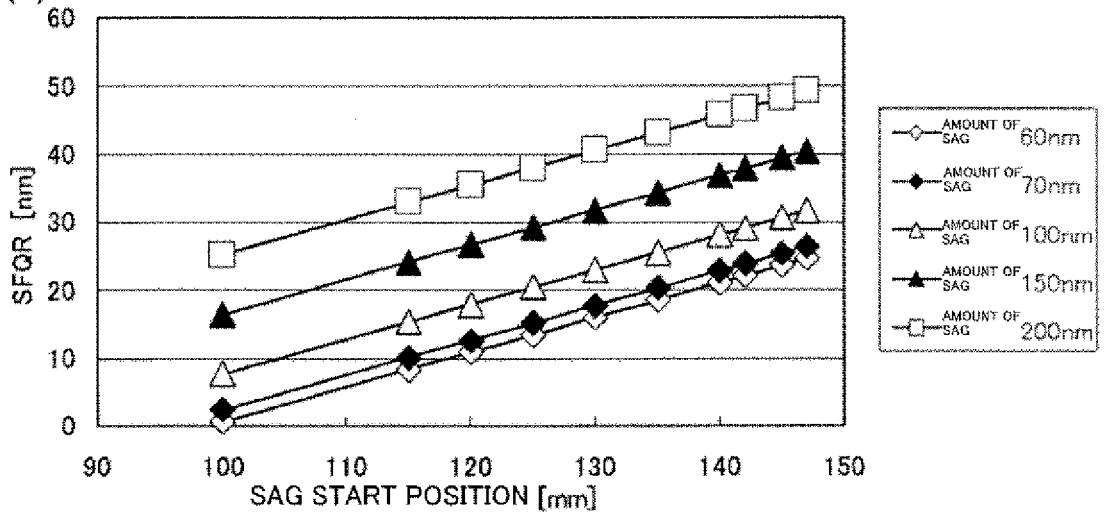
FIG. 8(a) is a view showing a correlation between an outer peripheral sag start position, a sag amount, and SFQR, and (b) is a view showing a correlation between the outer peripheral sag start position, the sag amount, and ESFQR.
Figure 8:
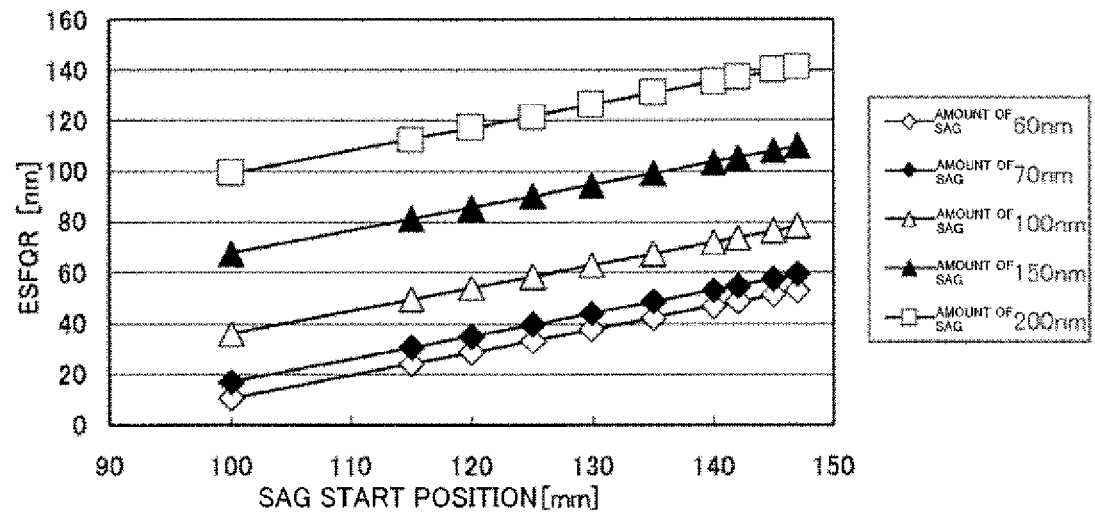

Subsequently, multiple regression analysis was conducted in regard to a correlation of an outer peripheral sag start position, an amount of outer peripheral sag, SFQR, and ESFQR by selecting each wafer that has a center convex shape as its wafer shape and has an outer peripheral sag start position and an amount of sag which are different from each other and using SFQR and ESFQR calculated from a cross-sectional shape. Table 5 shows data used for the analysis. It is to be noted that the outer peripheral sag start position and the amount of sag were visually observed from the cross-sectional shape. As to SFQR, a high correlation, i.e., a correlation coefficient R=0.82 was obtained. Likewise, as to ESFQR, a high correlation, i.e., a correlation coefficient R=0.85 was obtained. FIG. 8(a) shows a relationship between the outer peripheral sag start position, the amount of sag, and SFQR obtained from the multiple regression analysis, and FIG. 8(b) shows a relationship between the outer peripheral sag start position, the amount of sag, and SFQR obtained from the multiple regression analysis.

TABLE 5

| Outer peripheral sag start position (mm) | Amount of sag (nm) | SFQR (nm) | ESFQR (nm) |
|---|---|---|---|
| 100 | 50 | 1.62 | 17.06 |
| 100 | 100 | 2.50 | 16.92 |
| 135 | 70 | 20.11 | 51.71 |
| 140 | 45 | 21.59 | 38.74 |
| 140 | 50 | 23.99 | 43.03 |
| 140 | 70 | 38.78 | 92.56 |
| 140 | 100 | 31.74 | 86.10 |
| 140 | 150 | 29.77 | 87.37 |
| 144 | 30 | 14.39 | 25.83 |
| 145 | 20 | 9.59 | 17.22 |
| 146 | 30 | 19.61 | 27.77 |
| 147 | 20 | 13.07 | 18.51 |
| 148 | 20 | 15.29 | 19.17 |

As a result, it can be understood that, if the outer peripheral sag start position is 20 mm or more away from the outer peripheral end and the amount of sag is 100 nm or below, a wafer having SFQR of 25 nm or less and ESFQR of 70 nm or less can be obtained. Further, in case of a semiconductor wafer having such a shape, ZDD which is the evaluation index of a curvature can be also improved. Furthermore, since SBIR as the backsurface-reference corresponds to a difference in thickness of the outer peripheral portion (the amount of sag is a dominant deterioration factor), it can be improved by suppressing the amount of sag to 100 nm or less.

Based on the above-described results, the present inventors discovered that, when a semiconductor wafer shape is a center convex shape and has an amount of sag (a displacement from an outer peripheral sag start position to a position that is 1 mm away from an outer peripheral end toward center) being set to 100 nm or less or preferably 70 nm or less and has an outer peripheral sag start position is 20 mm or more away from the outer peripheral end preferably the outer peripheral sag start position is away from an outer peripheral portion as a ESFQR measurement target (the outer peripheral sag start position is 36 mm away from the outer peripheral end when a cell size of ESFQR is 1 to 35 mm), the indexes, e.g., SFQR, SBIR, ESFQR, ZDD, ROA, and others can be met at the same time regardless of an edge exclusion or a reference surface. Moreover, they also found out that, when the displacement from the central portion to the outer peripheral sag start position is 100 nm or less, GBIR which is an overall flatness index can be suppressed without being affected by SFQR, SBIR, ESFQR, ZDD, ROA, and others, thereby bringing the present invention to completion. The present invention will now be described hereinafter in more detail.

[Semiconductor Wafer]

According to the present invention, there is provided a semiconductor wafer having sag formed at an outer periphery at the time of polishing, wherein a displacement of the semiconductor wafer in a thickness direction is 100 nm or less between a center and a outer peripheral sag start position of the semiconductor wafer, and the center of the semiconductor wafer has a convex shape, an amount of outer peripheral sag of the semiconductor wafer is 100 nm or less, and the outer peripheral sag start position is away from an outer peripheral portion of the semiconductor wafer toward the center or 20 mm or more away from an outer peripheral end of the semiconductor wafer toward the center, the outer peripheral portion being a measurement target of ESFQR.

Figure 1:
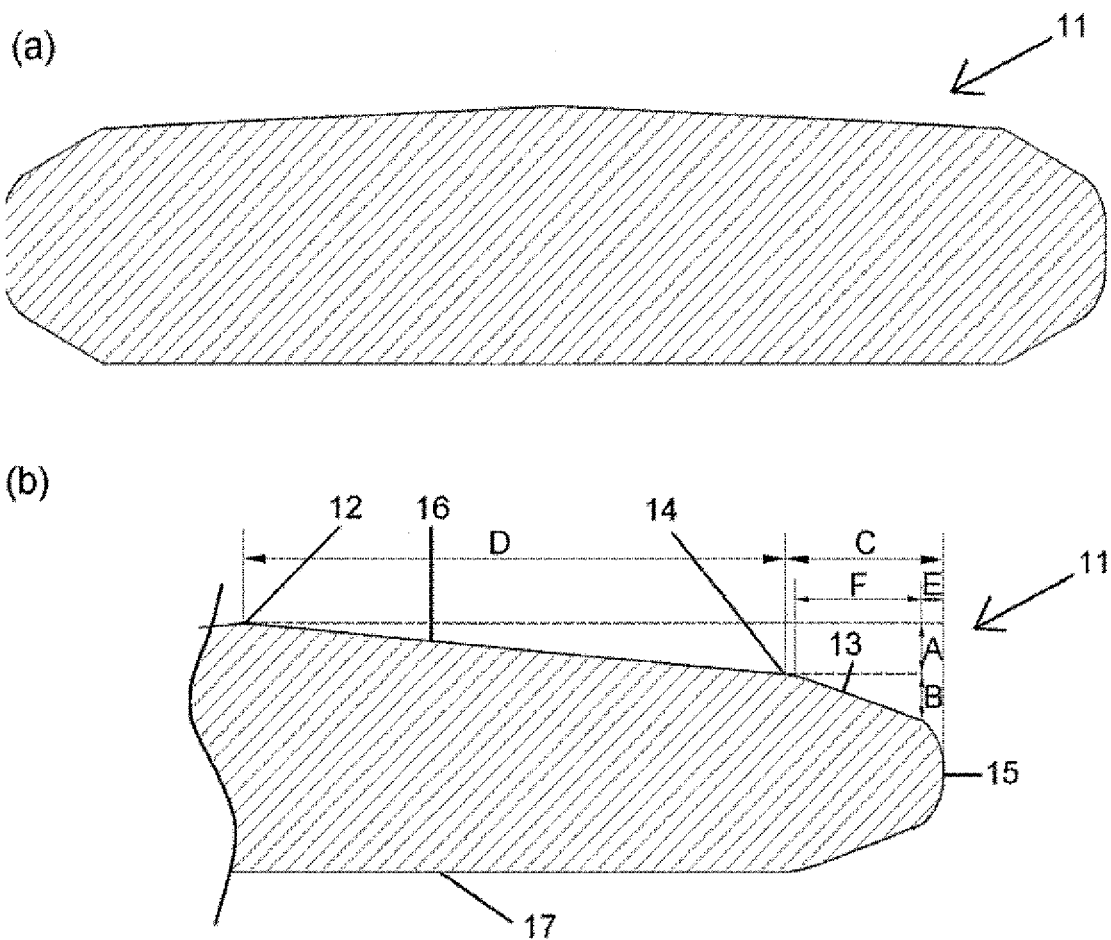
FIG. 1(a) is a schematic cross-sectional view of a semiconductor wafer according to the present invention, and (b) is a schematic enlarged cross-sectional view of an outer peripheral portion of a semiconductor wafer.

First, FIG. 1(a) shows a schematic cross-sectional view of a semiconductor wafer according to the present invention, and FIG. 1(b) shows a schematic enlarged cross-sectional view of an outer peripheral portion of the semiconductor wafer. An outer peripheral cross section of a semiconductor wafer 11 is formed of straight lines and curved lines having a substantially fixed curvature (FIG. 1(b)). Specifically, the semiconductor wafer 11 is constituted of a center 12, an outer peripheral sag 13, an outer peripheral sag start position 14, an outer peripheral end 15, a front surface 16, and a back surface 17. Additionally, a displacement of the semiconductor wafer in a thickness direction between the center and the outer peripheral sag start position of the semiconductor wafer is denoted by A, an amount of outer peripheral sag of the semiconductor wafer is denoted by B, a length from the outer peripheral end to the outer peripheral sag start position is denoted by C, and a portion between the center and the outer peripheral sag start position of the semiconductor wafer is denoted by D, and an edge exclusion is represented by E, and an outer peripheral portion of the semiconductor wafer as a measurement target of ESFQR is denoted by F (FIG. 1(b)).

In the semiconductor wafer 11 according to the present invention, the displacement A of the semiconductor wafer in the thickness direction between the center 12 and the outer peripheral sag start position 14 of the semiconductor wafer is 100 nm or below, and the center 12 of the semiconductor wafer has a convex shape (FIGS. 1(a) and (b)). If the displacement A from the center 12 to the outer peripheral sag start position 14 is 100 nm or less, GBIR as the overall flatness index can be suppressed. Further, when such a center convex shape is provided, respective virtual lines of SFQR and ESFQR approximate the same inclination, and hence both SFQR and ESFQR can be achieved.

Furthermore, according to the semiconductor wafer of the present invention, it is preferable for the amount of outer peripheral sag B of the semiconductor wafer 11 to be 100 nm or less, or preferably 70 nm or less (FIG. 1(b)). Moreover, according to the semiconductor wafer 11 of the present invention, the outer peripheral sag start position 14 is away from an outer peripheral portion of the semiconductor wafer toward the center or 20 mm or more away from an outer peripheral end of the semiconductor wafer toward the center, the outer peripheral portion being a measurement target of ESFQR (FIG. 1(b)). When the outer peripheral portion having such a shape is adopted, SFQR becomes 25 nm or less, ESFQR becomes 70 nm or less, the semiconductor wafer having the plurality of flatness indexes improved at the same time can be provided, and GBIR can be suppressed to 250 nm or less. In particular, if the amount of outer peripheral sag is 70 nm or less, the semiconductor wafer having the further improved flatness indexes, e.g., SFQR, ESFQR, ZDD, ROA, GBIR, SBIR, and others can be obtained.

It is to be noted that the semiconductor wafer according to the present invention is not restricted in particular as long as it meets the center convex shape, the amount of outer peripheral sag, and the outer peripheral sag start position, and it may be either a silicon semiconductor wafer or a compound semiconductor wafer.

Additionally, as a result of examining a method for obtaining the above-described semiconductor wafer, the present inventors found out that the semiconductor wafer having the center convex according to the present invention can be relatively easily manufactured under polishing conditions, discovered that the outer peripheral sag caused due to deformation of a polishing pad can be controlled and a target amount of sag can be obtained by selecting the polishing pad with hardness that is resistant to deformation, and brought the method for manufacturing the semiconductor wafer according to the present invention to completion. A method for stably obtaining a silicon wafer having the above-described shape will now be described hereinafter.

[Method for Manufacturing Semiconductor Wafer]

To manufacture the above-described semiconductor wafer, according to the present invention, there is provided a method for manufacturing a semiconductor wafer comprising a polishing step of polishing the semiconductor wafer after slicing a single-crystal ingot to obtain the semiconductor wafer and chamfering and flattening the semiconductor wafer, wherein, at the polishing step, the semiconductor wafer is subjected to double-sided polishing in such a manner that a displacement of the semiconductor wafer in a thickness direction becomes 100 nm or less between a center and an outer peripheral sag start position of the semiconductor and the center of the semiconductor wafer has a convex shape, and one side of the semiconductor wafer is then subjected to chemical-mechanical polishing in such a manner that an amount of outer peripheral sag of the semiconductor wafer becomes 100 nm or less and the outer peripheral sag start position is away from an outer peripheral portion of the semiconductor wafer toward the center or 20 mm or more away from an outer peripheral end of the semiconductor wafer toward the center, the outer peripheral portion being a measurement target of ESFQR.

[Preparation of Semiconductor Wafer to be Polished]

In the method for manufacturing a semiconductor wafer according to the present invention, although not restricted in particular, a semiconductor wafer polished by the following method can be prepared. First, a slicing step of slicing a single-crystal ingot to obtain a semiconductor wafer is performed. A method for manufacturing a semiconductor ingot is not restricted in particular, and a well-known method such as a Czochralski method (a CZ method) or a floating zone melting method (an FZ method) can be used. A slicing method is not restricted in particular, and slicing can be carried out by using an inner-diameter slicer, a multi-wire saw, or the like. Subsequently, a chamfering step of chamfering an outer peripheral portion of the semiconductor wafer obtained by this slicing step and forming a chamfered portion is performed. Thereafter, a flattening step of flattening the semiconductor wafer chamfered at the chamfering step is carried out. The flattening step can include a lapping step, a grinding step, an etching step, and others. With the above-described steps, the semiconductor wafer to be polished can be prepared.

[Polishing Step]

In case of a silicon wafer having a diameter of 300 mm, a polishing method based on a combination of double-side polishing and single-side polishing is generally adopted. To suppress an amount of sag in chemical-mechanical polishing, forming a center convex shape by a double-side polishing machine is preferable. In the double-side polishing, a silicon wafer having a center convex shape can be relatively easily created. Specifically, a method such as that in Japanese Unexamined Patent Publication (Kokai) No. 2003-285262 can be used. Further, even in case of a double-side polishing machine having no shape adjustment mechanism in a polishing turn table, a silicon wafer having a center convex shape can be obtained by adjusting dress conditions. Although a single-sided chemical-mechanical polishing enables obtaining the center convex shape, it is difficult to stably obtain a desired shape and a desired amount of sag if a shape after the double-sided polishing is unstable. Furthermore, changing polishing conditions in accordance with a shape after the double-sided polishing leads to a reduction in productivity, this is not preferable. Therefore, a method for forming an overall shape by the double-sided polishing and suppressing outer peripheral sag by the single-sided chemical-mechanical polishing is preferable.

Therefore, as described above, the semiconductor wafer is subjected to the double-sided polishing so that a displacement of the semiconductor wafer in a thickness direction can be 100 nm or less between the center and the outer peripheral sag start position of the semiconductor wafer and the center of the semiconductor wafer can have a convex shape. When the overall shape of the wafer is formed by the double-side polishing in this manner, since respective virtual lines of SFQR and ESFQR approximates the same inclination, both SFQR and ESFQR can be achieved.

Moreover, as described above, one side of the semiconductor wafer is subjected to the chemical-mechanical polishing so that an amount of the outer peripheral sag of the semiconductor wafer can be 100 nm or less and an outer peripheral sag start position can be away from an outer peripheral portion of the semiconductor wafer toward the center or 20 mm or more away from an outer peripheral end of the semiconductor wafer toward the center, the outer peripheral portion being a measurement target of ESFQR. When the chemical-mechanical polishing is performed to obtain the outer peripheral portion having such a shape, the semiconductor wafer having SFQR of 25 nm or less and ESFQR of 70 nm or less can be obtained, and the semiconductor wafer having a plurality of flatness indexes improved at the same time can be manufactured. In particular, if the amount of outer peripheral sag is 70 nm or less, the semiconductor wafer having the more improved flatness indexes, such as SFQR, ESFQR, ZDD, ROA, GBIR, SBIR, and others, can be manufactured.

Additionally, in the single-sided chemical-mechanical polishing, it is preferable to perform single-sided polishing to the semiconductor wafer with use of a nonwoven type polishing pad having an Asker-C hardness of 60 or more or a polyurethane type hard polishing pad having a Shore-D hardness of 55 or more. Although the amount of sag in the chemical-mechanical polishing varies depending on polishing conditions, a degree of dependence on an amount of deformation of the polishing pad is high, selecting such a hard polishing pad enables obtaining a desired amount of sag by adjusting the polishing conditions. Further, optimizing a polishing load or the number of revolutions also enables obtaining an amount of sag that is 70 nm or less.

EXAMPLES

The present invention will now be more specifically explained hereinafter based on examples and a comparative example, but the present invention is not restricted to the following examples.

Example 1

A single-crystal ingot was sliced to obtain a silicon wafer having a diameter of 300 mm, and this silicon wafer was chamfered and flattened. Thereafter, with use of a double-sided polishing machine disclosed in Japanese Unexamined Patent Publication (Kokai) No. 2003-285262, adjustment was carried out under conditions that a displacement of the semiconductor wafer in a thickness direction can be 100 nm between a center and an outer periphery sag start position of the semiconductor wafer and the center of the semiconductor wafer can have a convex shape, and double-sided polishing was performed. At this time, since occurrence of the outer peripheral sag due to the double-sided polishing is not preferred, a hard urethane foam pad was used as a polishing pad, which is specifically MH-S15A manufactured by Nitta Haas Incorporated. As polishing slurry, polishing abrasive grains made of colloidal silica having a grain size of 0.05 μm were adjusted to pH 10.5, and polishing was carried out with a polishing load of 200 g/cm². To stably obtain the wafer having the center convex shape, a turntable shape adjustment mechanism was used to form an upper polishing turn table shape into an upper convex shape (a shape that a turntable outer side position is lower than a turntable center), an initial slurry supply amount was set to 4 l/min, and polishing was performed in accordance with a life of the polishing pad while appropriately adjusting a slurry flow volume. One side of the semiconductor wafer was then subjected to the chemical-mechanical polishing so that an amount of outer peripheral sag of the semiconductor wafer can be 100 nm and an outer peripheral sag start position can be 20 mm or more away from an outer peripheral end of the semiconductor wafer toward the center. At this time, as a polishing pad of the chemical-mechanical polishing, nonwoven fabric cloth which is specifically Suba 800 (Asker-C hardness 82) manufactured by Nitta Haas Incorporated. As polishing slurry, polishing abrasive grains made of colloidal silica having a grain size of 0.05 μm were adjusted to pH 10.5, and polishing was carried out with a polishing load of 150 g/cm², a slurry supply amount of 3 l/min, the number of revolutions of the polishing turn table which is 30 rpm, and the number of revolutions of a polishing head which is 30 rpm. Then, final polishing was performed to manufacture a silicon wafer according to Example 1. It is to be noted that the outer peripheral sag occurs due to the final polishing, but a polishing removal is small, an influence of the chemical-mechanical polishing on the outer peripheral sag is approximately 10%, and hence this polishing was carried out under regular conditions without changing conditions in particular.

Example 2

In regard to a polishing pad surface temperature during polishing, since heat generated during polishing is accumulated, a temperature at a central portion of the polishing pad is relatively higher than that at an outer peripheral portion. Since this temperature difference affects a polishing rate, controlling this area range enables controlling a sag start position. In Example 2, a silicon wafer according to Example 2 was manufactured like Example 1 except that a polishing load, a number of revolutions of a head, and a slurry supply temperature were adjusted so as not to change a radial average removal of a wafer, a high-temperature area was enlarged as compared with that in Example 1, and one side of the silicon wafer was subjected to chemical-mechanical polishing so that an outer peripheral sag start position can be away from an outer peripheral portion of the semiconductor wafer toward the center. (the position that is 35 mm away from an outer peripheral end) as a measurement target of ESFQR.

Comparative Example 1

Moreover, a silicon wafer according to Comparative Example 1 was manufactured like Example 1 except that adjustment, double-sided polishing, and chemical-mechanical polishing were carried out so as to form a rising shape like a conventional example.

Figure 9:
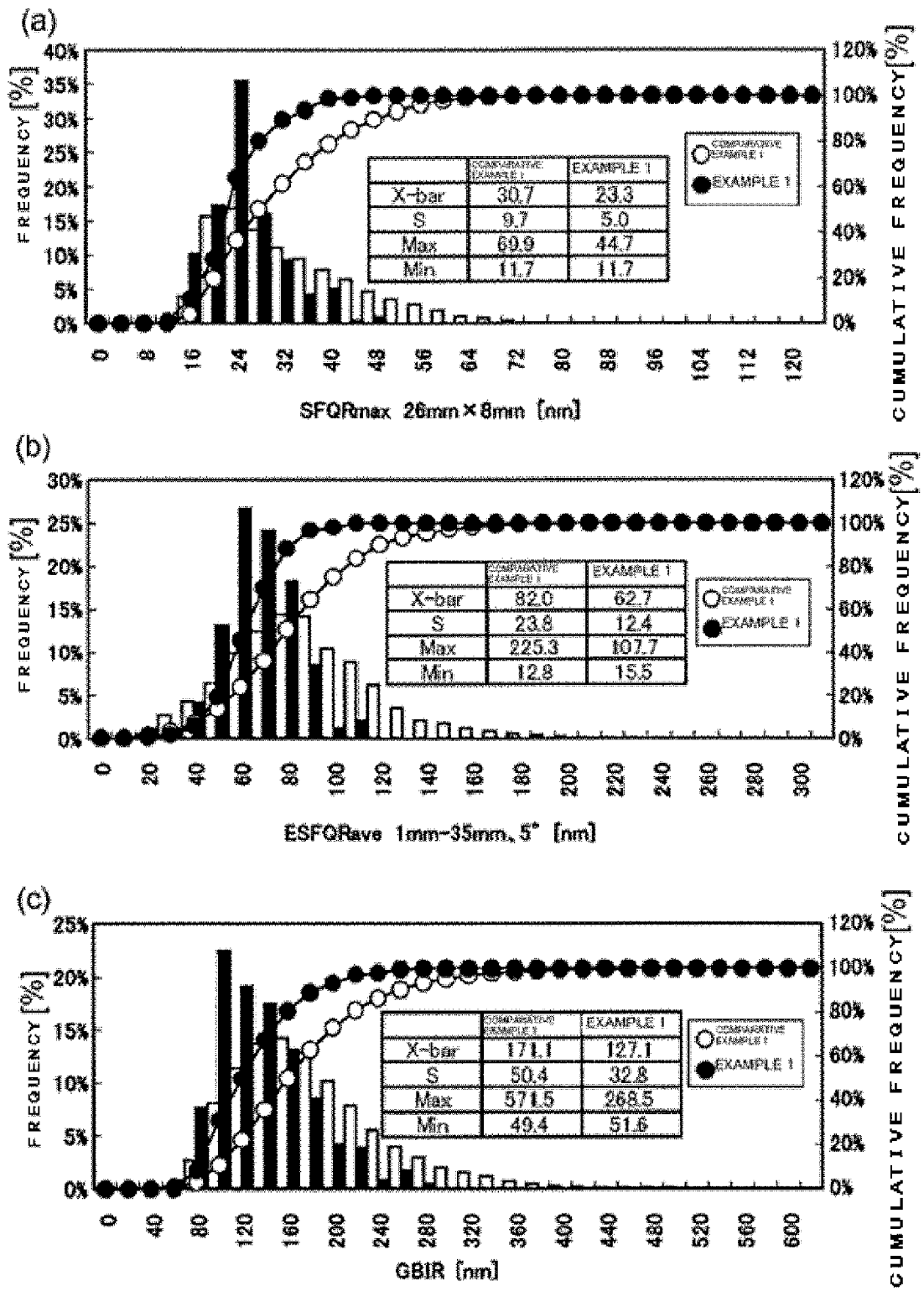
FIG. 9(a) is a view showing SFQRmax of silicon wafers manufactured according to Example 1 and Comparative Example 1, (b) is a view showing ESFQRave of the same, and (c) is a view showing GBIR of the same.
Figure 10:
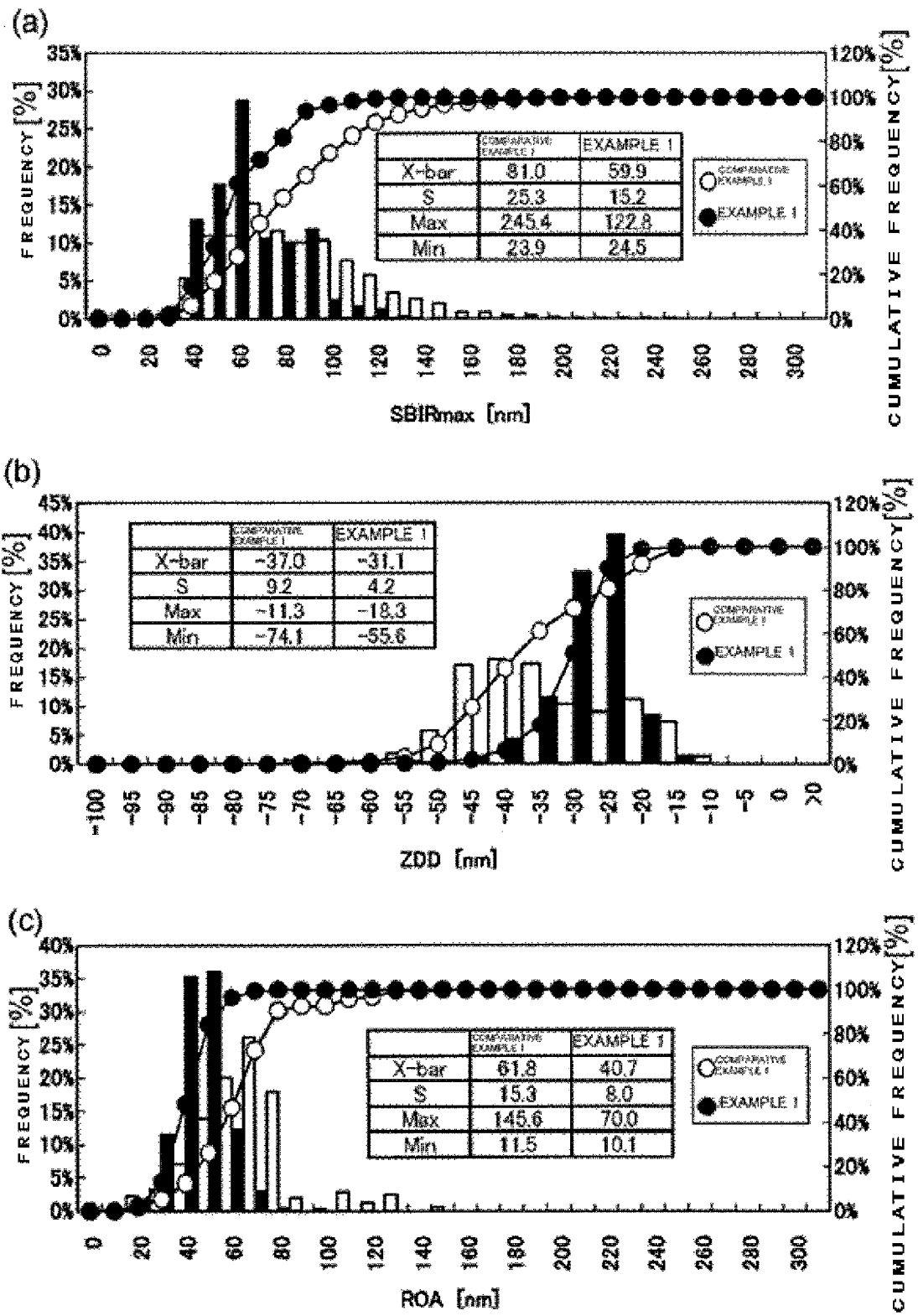
FIG. 10(a) is a view showing SBIRmax of silicon wafers manufactured according to Example 1 and Comparative Example 1, (b) is a view showing ZDD of the same, and (c) is a view showing ROA of the same.

FIG. 9(a) shows SFQRmax, FIG. 9(b) shows ESFQRave, FIG. 9(c) shows GBIR, FIG. 10(a) shows SBIRmax, FIG. 10(b) shows ZDD, and FIG. 10(c) shows ROA after the chemical-mechanical polishing of the silicon wafer according to each of Example 1 and Comparative Example 1 manufactured as described above in comparison to each other. In FIG. 9 and FIG. 10, Example 1 is represented by a black circle (●) and Comparative Example 1 is represented by a white circle (○). Further, a blackened bar graph represents Example 1, and a non-blackened bar graph represents Comparative Example 1. In comparison with Comparative Example 1, flatness was improved in all quality items and both SFQR and ESFQR which are hard to be achieved at the same time were greatly improved in Example 1.

Figure 11:
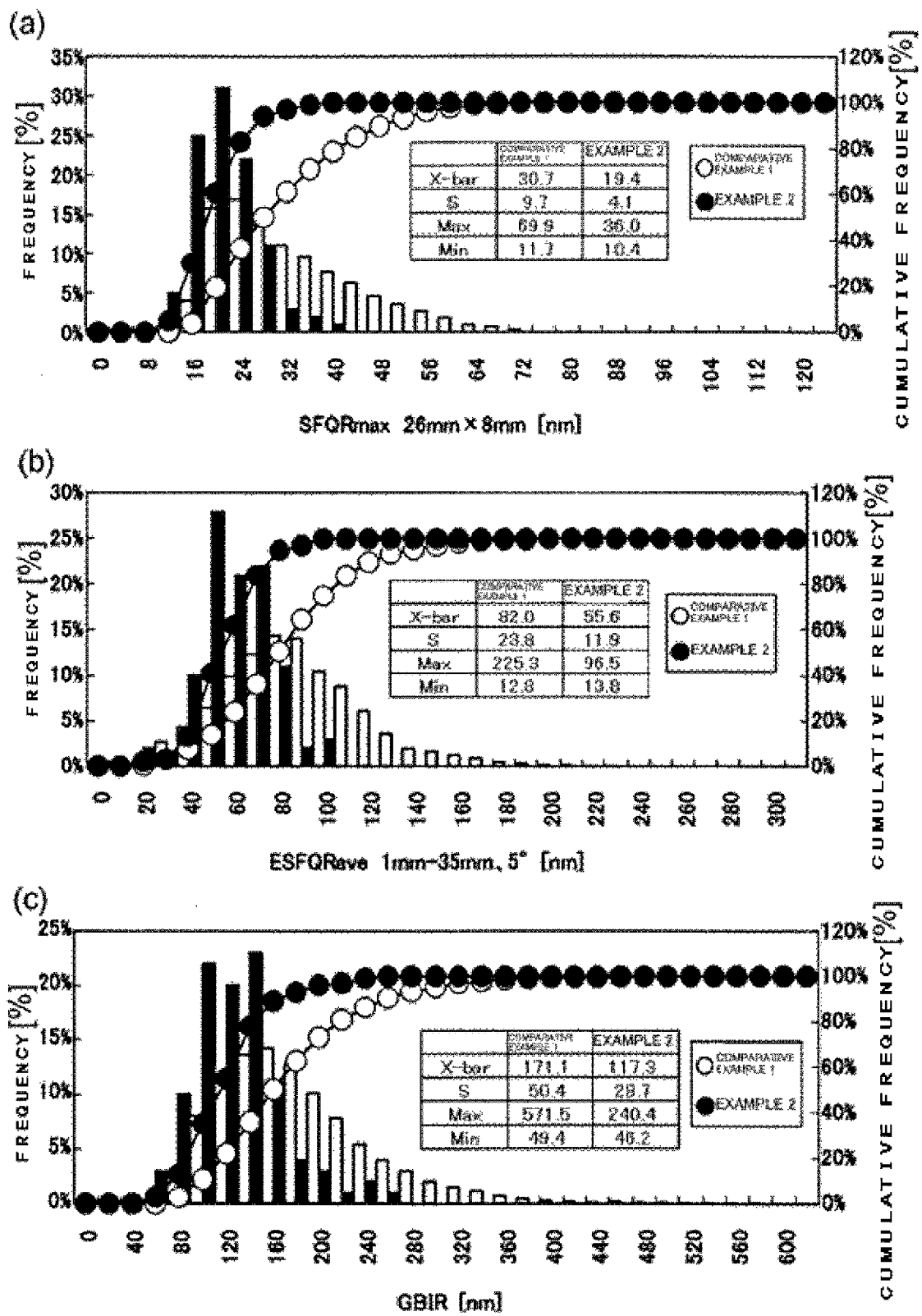
FIG. 11(a) is a view showing SFQRmax of silicon wafers manufactured according to Example 2 and Comparative Example 1, (b) is a view showing ESFQRave of the same, and (c) is a view showing GBIR of the same.
Figure 12:
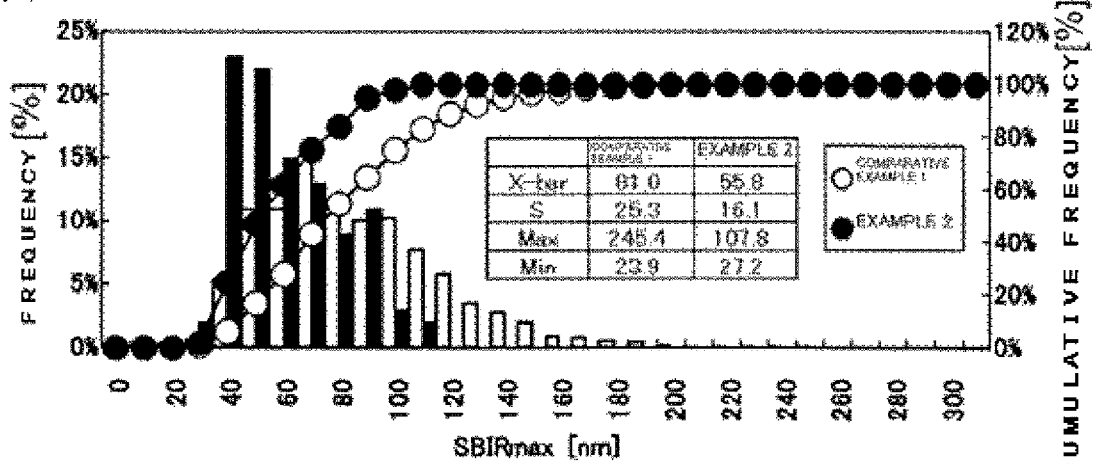
FIG. 12(a) is a view showing SBIRmax of the silicon wafers manufactured according to Example 2 and Comparative Example 1, (b) is a view showing ZDD of the same, and (c) is a view showing ROA of the same.
Figure 12:
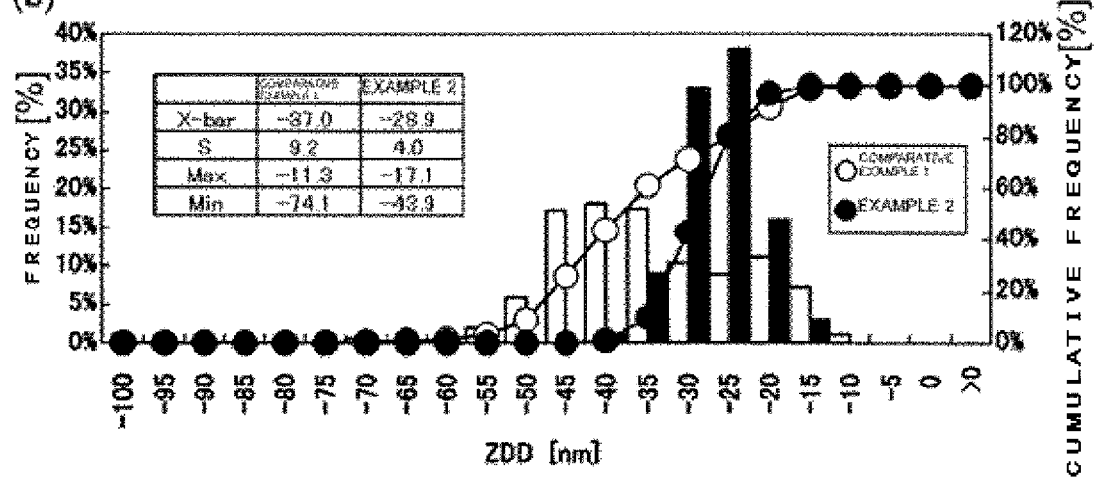
Figure 12:
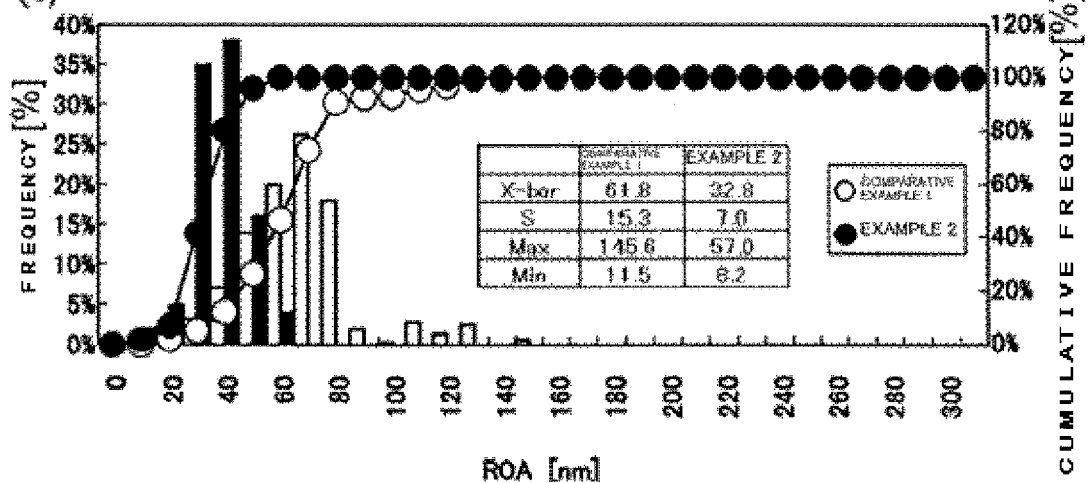
Figure 13:
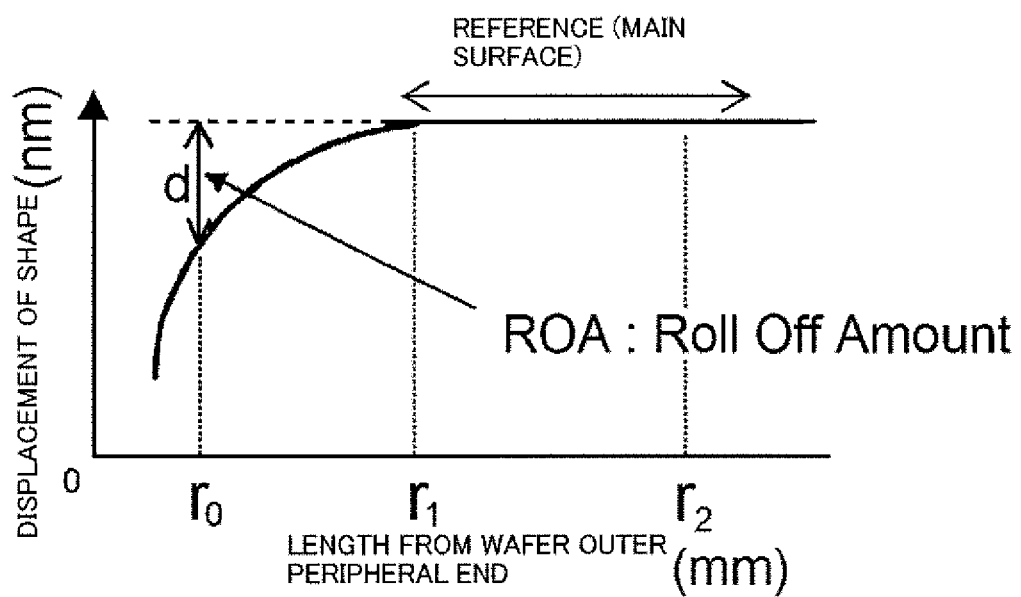
FIG. 13 is a cross-sectional view for explaining ROA in a semiconductor wafer.
Figure 14:
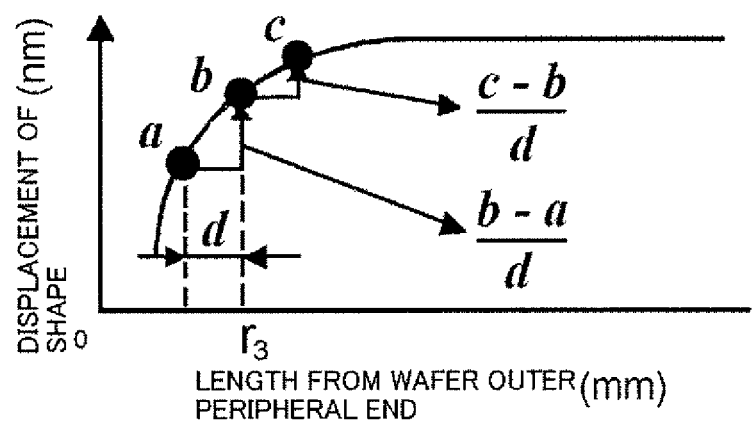
FIG. 14 is a cross-sectional view for explaining ZDD in a semiconductor wafer.
Figure 15:
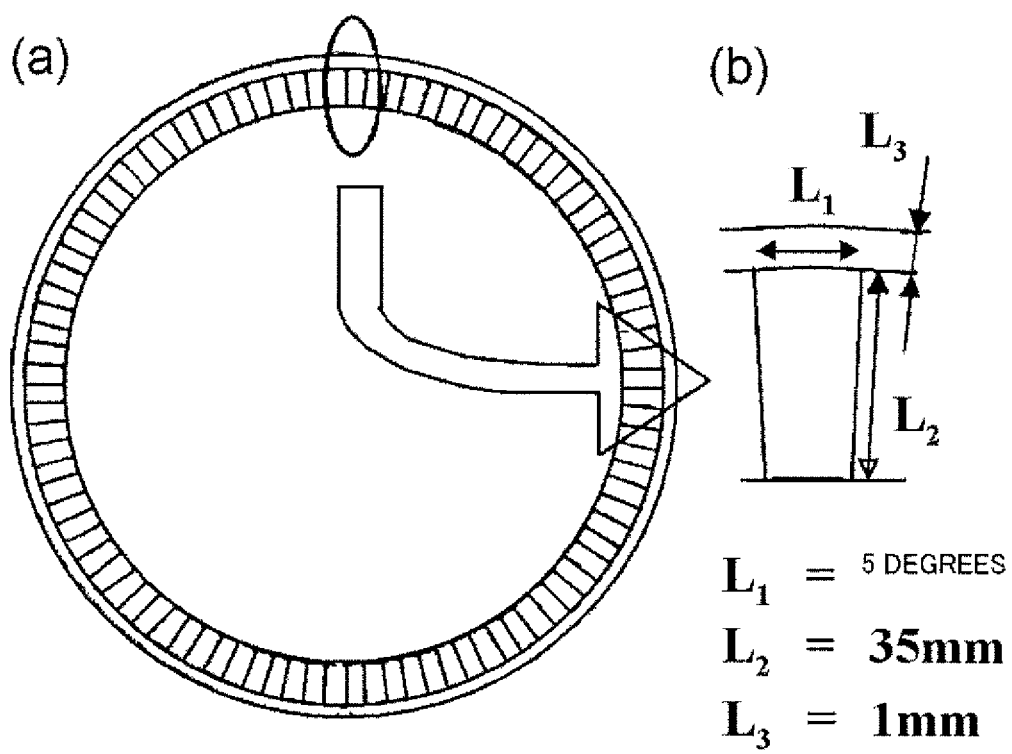
FIG. 15 is a top view for explaining ESFQR in a semiconductor wafer.

FIG. 11(a) shows SFQRmax, FIG. 11(b) shows ESFQRave, FIG. 11(c) shows GBIR, FIG. 12(a) shows SBIRmax, FIG. 12(b) shows ZDD, and FIG. 12(c) shows ROA after chemical-mechanical polishing of the silicon wafer according to each of Example 2 and Comparative Example 1 fabricated as described above in comparison with each other. In FIG. 11 and FIG. 12, Example 2 is represented by a black circle (●) and Comparative Example 1 is represented by a white circle (○). Furthermore, a blackened bar graph represents Example 2, and a non-blackened bar graph represents Comparative Example 1. In comparison with Comparative Example 1, flatness was improved in all quality items and both SFQR and ESFQR which are hard to be achieved at the same time were greatly improved in Example 2.

As described above, according to the present invention, it is possible to provide the semiconductor wafer that can minimize deviations from reference surfaces at the same time in a plurality of flatness indexes, e.g., SFQR, ESFQR, ROA, and others having different edge exclusions and can also suppress a change in curvature that occurs at an outer peripheral portion by a combination of a center convex shape and an outer peripheral sag shape. Further, when the semiconductor wafer having such a shape is adopted, not only the frontsurface-referenced flatness indexes but also the backsurface-referenced flatness indexes (GBIR, SBIR) and the curvature evaluation index such as ZDD can be met at the same time. Further, it is possible to cope with demands of all customers under the same conditions, and a plurality of customer demands can be met. Moreover, since management can be carried out under the same processing conditions, and hence productivity and a yield of the semiconductor wafer can be improved.

It is to be noted that the present invention is not restricted to the foregoing embodiment. The foregoing embodiment is just an illustrative example, and any example that has substantially the same configuration and exerts the same functions and effects as the technical concept described in claims of the present invention is included in the technical scope of the present invention.

The invention claimed is:

1. A semiconductor wafer having sag formed at an outer periphery at the time of polishing, wherein
   a displacement of the semiconductor wafer in a thickness direction is 100 nm or less between a center and an outer peripheral sag start position of the semiconductor wafer, the center of the semiconductor wafer has a convex shape,
   an amount of the outer peripheral sag of the semiconductor wafer is 100 nm or less, and
   the outer peripheral sag start position is away from an outer peripheral portion of the semiconductor wafer toward the center or 20 mm or more away from an outer peripheral end of the semiconductor wafer toward the center, the outer peripheral portion being a measurement target of ESFQR.

2. The semiconductor wafer according to claim 1, wherein the amount of outer peripheral sag is 70 nm or less.

3. A method for manufacturing a semiconductor wafer comprising a polishing step of polishing the semiconductor wafer after slicing a single-crystal ingot to obtain the semiconductor wafer and chamfering and flattening the semiconductor wafer, wherein
   in the polishing step, the semiconductor wafer is subjected to double-sided polishing using a double-sided polishing machine of which an upper polishing turn table shape is formed into an upper convex shape in such a manner that a displacement of the semiconductor wafer in a thickness direction becomes 100 nm or less between a center and an outer peripheral sag start position of the semiconductor and the center of the semiconductor wafer has a convex shape, and
   one side of the semiconductor wafer is then subjected to chemical-mechanical polishing using a nonwoven type polishing pad having are Asker-C hardness of 60 or more or a polyurethane type polishing pad having a Shore-D hardness of 55 or more, and controlling an area range where a temperature at a central portion of the polishing pad is higher than a temperature at an outer peripheral portion of the polishing pad in such a manner that an amount of outer peripheral sag of the semiconductor wafer becomes 100 nm or less and the outer peripheral sag start position is away from an outer peripheral portion of the semiconductor wafer toward the center or 20 mm or more away from an outer peripheral end of the semiconductor wafer toward the center, the outer peripheral portion being a measurement target of ESFQR.

4. The method for manufacturing a semiconductor wafer according to claim 3,
   wherein, in the polishing step, the semiconductor wafer is polished in such a manner that the amount of outer peripheral sag becomes 70 nm or less.

* * * * *